United States Patent [19]

Cook et al.

[11] Patent Number: 4,616,173

[45] Date of Patent: Oct. 7, 1986

[54] FREQUENCY COUNTER

[75] Inventors: Terry Cook, Sioux Falls; Timothy Graham, Hartford, both of S. Dak.

[73] Assignee: Sencore, Inc., Sioux Falls, S. Dak.

[21] Appl. No.: 591,875

[22] Filed: Mar. 21, 1984

[51] Int. Cl.[4] ............................................. G01R 23/02
[52] U.S. Cl. ................................ 324/78 D; 324/78 R; 331/176
[58] Field of Search ............... 331/176, 66; 324/78 R, 324/78 D, 79 R, 79 D; 328/133, 134

[56]  References Cited

U.S. PATENT DOCUMENTS

| 3,713,033 | 1/1973 | Frerking | 331/176 |
| 4,257,005 | 3/1981 | Hall | 324/78 R |
| 4,297,657 | 10/1981 | Frerking | 331/66 |
| 4,325,036 | 4/1982 | Kuwabara | 331/176 |
| 4,380,745 | 4/1983 | Barlow | 331/176 |

Primary Examiner—Michael J. Tokar
Attorney, Agent, or Firm—Edmond T. Patnaude

[57]  ABSTRACT

A frequency counter employs a temperature sensitive oscillator mounted in proximity to a master crystal oscillator to provide an output frequency which varies appreciably with changes in ambient temperature and the frequency of the temperature sensitive oscillator is periodically counted and compared to a table of correction factors stored in memory to select a correction factor which is applied to the counted frequency of an input signal to provide a temperature corrected frequency count.

9 Claims, 2 Drawing Figures

FREQUENCY COUNTER

The present invention relates in general to crystal controlled frequency counters, and it relates more particularly to a new and improved circuit and method for compensating for the frequency drift of a crystal oscillator due to changes in temperature.

BACKGROUND OF THE INVENTION

One of the most accurate ways of measuring frequency is with a frequency counter which displays numerically the frequency of the signal applied to its input. Frequency counters generally employ a crystal oscillator for generating a reference frequency against which the frequency of the input signal is compared. Consequently, the accuracy of the frequency counter is dependent on the accuracy of the reference frequency and thus on the accuracy of the reference or master crystal oscillator.

Since the oscillator frequency tends to change in response to changes in the ambient temperature the crystal oscillators of precision frequency counters have been mounted in constant temperature ovens which maintain the crystal oscillators at constant temperatures irrespective of ambient temperature changes within a wide range. A disadvantage of such temperature controlled devices is the large amount of power which they consume. Consequently, high accuracy, portable frequency counters are rare, and those that are on the market have short battery lives.

SUMMARY OF THE INVENTION

Briefly, there is provided in accordance with the present invention a precision frequency counter which includes means for compensating for the frequency drift of the master crystal oscillator due to temperature changes, thereby avoiding the necessity of maintaining the temperature of the oscillator constant.

A frequency counter embodying this invention includes a microprocessor which is clocked by the input signal from the master crystal oscillator and measures the frequency of the input by comparing the input frequency to that of the clock pulses.

In a preferred embodiment of the invention there is provided a second oscillator, and it is mounted in proximity to the master oscillator so that both oscillators have the same ambient temperature. While the frequency of the crystal controlled master oscillator does not change appreciably with changes in ambient temperature, the second oscillator is designed so as to change frequency drastically in response to ambient temperature changes. Periodically, say every minute, the second oscillator is enabled and its output is coupled to the counting circuits where its frequency is compared to that of the master oscillator and counted by the microprocessor. The thusly measured frequency of the second oscillator, which is related to the ambient temperature of the two oscillators, is compared by the microprocessor to a table of correction factors programmed into an EPROM to determine the proper correction factor. The input frequency counted by the microprocessor is thereafter multiplied by the correction factor selected from the EPROM before being displayed. Inasmuch as the table of correction factors is not the same for all crystal oscillators the EPROM in each frequency counter is preferably programmed with a table of correction factors characteristic of the particular oscillator with which it is used.

GENERAL DESCRIPTION OF THE DRAWING

The present invention will be better understood by a reading of the following detailed description taken in connection with the accompanying drawing wherein:

FIG. 1 is a block diagram of a frequency counter embodying the present invention; and FIG. 2 is a schematic circuit diagram of a temperature measuring oscillator embodying the present invention.

DETAILED DESCRIPTION OF A PREFERRED EMBODIMENT OF THE INVENTION

Figure 1:
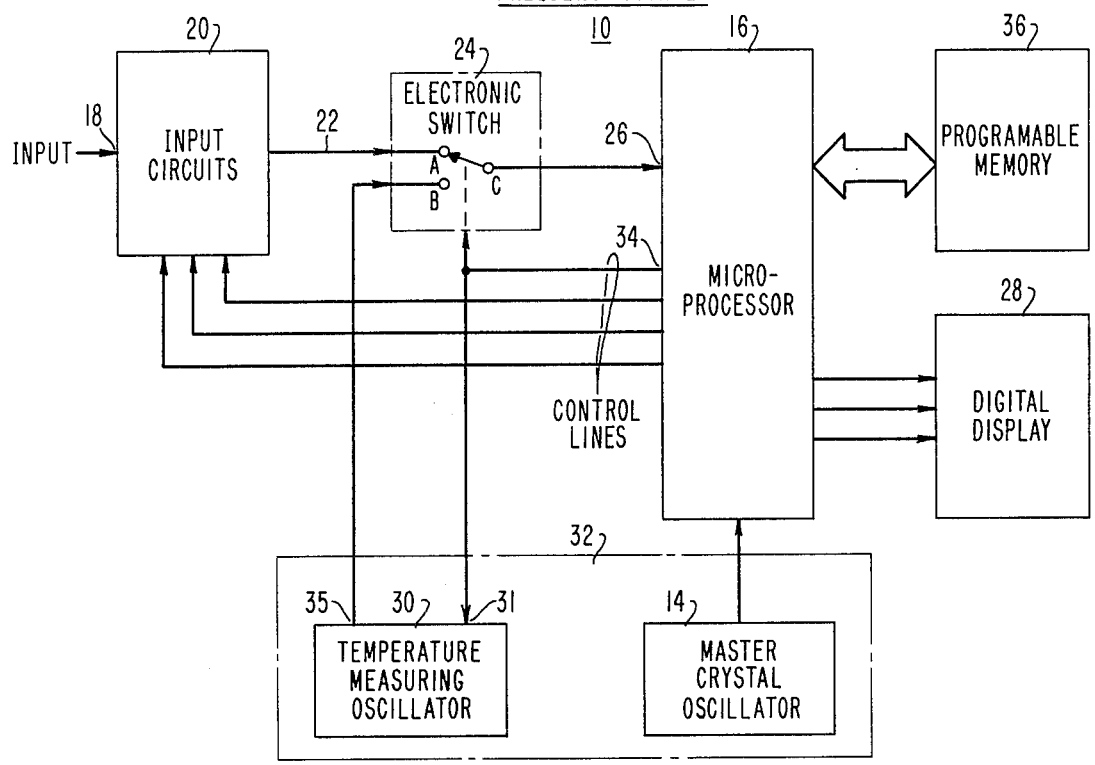

Referring to the drawing, it may be seen that a frequency counter 10 comprises a master crystal oscillator 14. The oscillator 14 may be of any suitable configuration wherein the frequency is relatively constant throughout the temperature range in which the counter is likely to be used. The output signal from the master oscillator 14 is a train of pulses occuring at the desired reference frequency of, for example, 6 mHz, and that signal is applied to the clock input of a microprocessor 16 to clock a counting circuit incorporated in the microprocessor.

The input signal whose frequency is to be measured is applied to an input jack 18 which is connected to the input circuits 20. The input circuits 20, which are controlled by the microprocessor 16, are conventional prescaler and amplifier circuits, and the output signal therefrom is coupled via a connection 22 to the terminal A of an electronic switch 24 shown schematically in the drawing. The signal appearing on line 22 will have a maximum frequency of about 100 kHz, the frequency thereof being proportional to the frequency of the input signal. During normal operation, the switch 24 connects the terminal A to the common terminal C which is connected to a signal input terminal 26 of the microprocessor 16. The microprocessor 16 compares the frequency of the signal applied to its input 26 with the frequency of the clock pulses from the master crystal oscillator 14 to develop an input signal for a digital display 28, which input signal is representative of the frequency of the input signal applied to the terminal 26. As thus far described, the frequency counter 10 is conventional, and the accuracy of the counter will vary with changes in the ambient temperature from the reference temperature for which the frequency counter was designed. For example, if the ambient temperature change causes the frequency of the master oscillator 14 to be changed by 0.001 percent, the frequency displayed by the digital display 28 will be inaccurate by a factor of 0.001 percent.

In accordance with the present invention, a second oscillator 30, which functions as a temperature measuring oscillator, is mounted in proximity to the master crystal oscillator 14 so that both oscillators have the same ambient temperature. Preferably, the two oscillators are mounted in a single, thermally insulated enclosure 32. The output signal from the oscillator 30 is connected to a switch terminal B of the electronic switch 24. The oscillator 30 is enabled by a signal on an output terminal 34 of the microprocessor 16 connected to the enable terminal 31 of the oscillator 30, which enabling signal also causes the switch 24 to connect terminal B to terminal C and to disconnect terminal A from terminal C. It will thus be apparent to those skilled in the art that when the enabling signal is present on the output terminal 34, the output 35 of the oscillator 30 is coupled to the input terminal 26 of the microprocessor.

During occurence of the enabling signal at the output terminal 34, the frequency of the signal from the oscillator 30 is counted or measured by comparing it to the frequency of the clock pulses from the master crystal oscillator 14. This measured frequency is then compared to a table of correction factors versus frequency which is programed in a programmable memory 36, and the corresponding correction factor is selected and stored in the microprocessor 16. Thereafter when the enabling signal terminates and the switch 24 returns to its normal frequency measuring state, the measured frequency is combined with the correction factor last stored in the microprocessor 16 before being used to drive the digital display 28. Preferably, the correction factor is a multiplier by which the measured frequency is multiplied before being displayed.

In a preferred embodiment of the invention, the enabling signal is provided at the output terminal 34 once each minute and has a duration of about one second. During this one second period the digital display is latched to display the last frequency measurement of the input signal.

Because the rate of frequency change versus temperature change is much greater for the oscillator 30 than it is for the oscillator 14, the method and circuit of this invention compensates for even very small changes in the frequency of oscillation of the crystal oscillator 14.

In a preferred embodiment of the invention the temperature measuring oscillator 30 is an RC oscillator in which the resistor is replaced by one or more thermistors causing the oscillator frequency to vary from about 500 Hz to about 15 kHz in the temperature range of −25 C. to 50 C. On the other hand, the frequency of the crystal oscillator 14 may vary only about twenty parts per million throughout the same frequency range.

The microprocessor 16 may be of the Cmos type commercially available under number 80C35, and the programmable memory 36 may be an EPROM available commercially under number 27C32.

Figure 2:
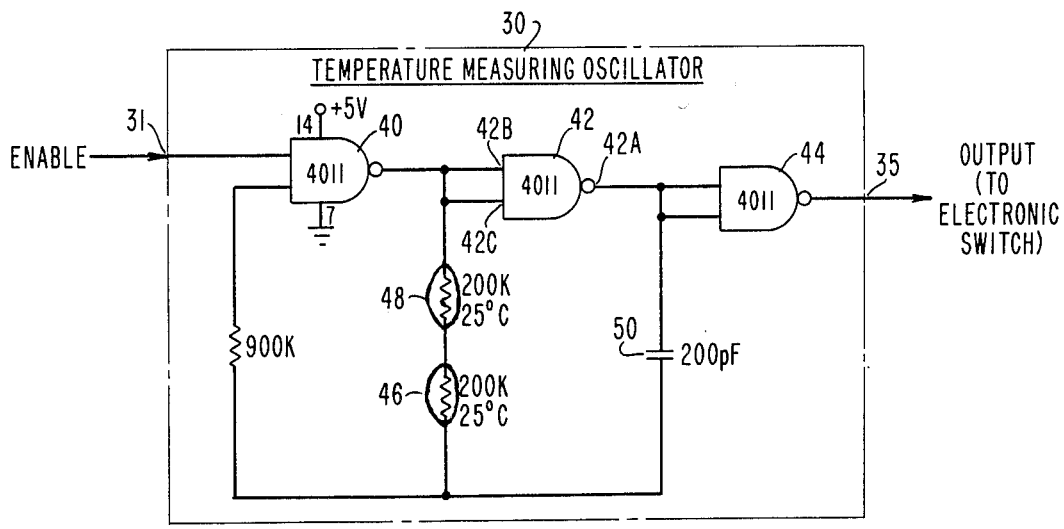

Referring to FIG. 2 there is shown an RC oscillator suitable for use as the temperature measuring oscillator 30 in the frequency counter 10 of FIG. 1. As there shown, when the enable terminal 31 goes high a NAND gate 40 activates a NAND gate 42 which in turn activates a NAND gate 44. A pair of thermistors 46 and 48 whose resistance values are porportional to their ambient temperature and vary substantially with changes in temperature are serially connected with a capacitor 50 in the positive feed back path from the output 42A of gate 42 to its two inputs 42B and 42C. Except for the inclusion of the thermistors in the feedback path, the oscillator 30 is a conventional RC type oscillator employing three CMOS gates. The circuit oscillates at a frequency equal to about 0.4/(R1 C) where the value of R1 is the sum of the resistance values of the two thermistors 46 and 48. It is apparent that large changes in frequency will result from relatively small changes in temperature.

While the present invention has been described in connection with a particular embodiment thereof, it will be understood by those skilled in the art that many changes and modifications may be made without departing from the true spirit and scope of the present invention. Therefore, it is intended by the appended claims to cover all such changes and modifications which come within the true spirit and scope of this invention.

We claim:

1. A method of measuring and displaying a visible representation of the frequency of an input signal, comprising the steps of
   mounting first and second oscillators in mutual proximity so that said oscillators have a common ambient temperature,
   said second oscillator having an output frequency which changes in response to changes in said ambient temperature to a greater extent than does the output frequency of said first oscillator,
   periodically comparing the output frequencies of said first and second oscillators and developing therefrom a compensating factor relative to the difference between said output frequencies,
   comparing the frequency of said input signal with the output frequency of said first oscillator to provide a frequency representative signal proporational to the frequency of said output signal,
   combining said correction factor with said frequency representative signal to provide a temperature compensated frequency related signal, and
   displaying a visible representation of the frequency of said compensated, frequency related signal.

2. A method according to claim 1 wherein said step of developing a compensating factor includes the steps of
   storing a table of correction factors versus frequency and
   utilizing said table to develop said compensating factor.

3. A method according to claim 1 wherein the frequency of said first oscillator is crystal controlled.

4. A method according to claim 2 wherein said second oscillator includes a thermistor in its feedback circuit.

5. A method according to claim 4 wherein said step of mounting is carried out by
   mounting said first and second oscillators in a single enclosure.

6. A frequency counter, comprising in combination
   an input to which a test signal is adapted to be applied,
   a master oscillator,
   comparator means for comparing the respective frequencies of said test signal and said master oscillator to provide an output signal representative of the frequency of said test signal,
   a temperature sensitive oscillator mounted in proximity to said master oscillator,
   said temperature sensitive oscillator including an RC feedback path including a resistor and wherein the value of the resistance in said feedback path is proportional to the ambient temperature of said resistor,
   means for comparing the respective frequencies of said oscillators to provide a temperature indicating signal having a frequency proportional to the temperature of said temperature sensitive oscillator,
   means responsive to said temperature indicating signal for producing a compensating factor proportional to the frequency deviation of said master oscillator at the temperature represented by the temperature indicating signal,
   means for combining the output frequency of said comparator means and said compensating factor to provide a temperature compensated output signal, and means for displaying the frequency of said temperature compensated output signal.

7. A frequency counter comprising in combination an input to which a test signal is adapted to be applied, a master oscillator, comparator means for comparing the respective frequencies of said test signal and said master oscillator to provide an output signal representative of the frequency of said test signal, a temperature sensitive oscillator mounted in proximity to said master oscillator, means for comparing the respective frequencies of said oscillators to provide a temperature indicating signal having a frequency proportional to the temperature of said temperature sensitive oscillator, means responsive to said temperature indicating signal for producing a compensating factor proportional to the frequency deviation of said master oscillator at the temperature represented by the temperature indicating signal, means for combining the output frequency of said comparator means and said compensating factor to provide a temperature compensated output signal, and means for displaying the frequency of said temperature compensated output signal.

8. A frequency counter according to claim 6 wherein said resistor is a thermistor.

9. A frequency counter according to claim 8 wherein master oscillator is a crystal oscillator.

* * * * *